United States Patent
Kulas (10) Patent No.: US 7,356,186 B2
(45) Date of Patent: Apr. 8, 2008

(54) DIGITAL REPRESENTATION OF AUDIO WAVEFORMS USING PEAK SHIFTING TO PROVIDE INCREASED DYNAMIC RANGE

(76) Inventor: Charles J. Kulas, 651 Orizaba Ave., San Francisco, CA (US) 94132

( * ) Notice: Subject to any disclaimer, the term of this patent is extended or adjusted under 35 U.S.C. 154(b) by 653 days.

(21) Appl. No.: 10/227,099

(22) Filed: Aug. 23, 2002

(65) Prior Publication Data

US 2004/0039565 A1 Feb. 26, 2004

(51) Int. Cl.
*G06K 9/46* (2006.01)
(52) U.S. Cl. .................. 382/207; 341/132; 341/143; 381/94.8; 704/500
(58) Field of Classification Search .............. 341/132, 341/143; 381/94.8, 102; 382/207; 700/94; 704/500
See application file for complete search history.

(56) References Cited

U.S. PATENT DOCUMENTS

| | | | | |
|---|---|---|---|---|
| 5,182,558 A | * | 1/1993 | Mayo | 341/118 |
| 5,610,608 A | * | 3/1997 | Yamada et al. | 341/143 |
| 5,633,669 A | * | 5/1997 | Hada et al. | 347/132 |
| 5,802,250 A | * | 9/1998 | Kao | 704/228 |
| 5,852,566 A | * | 12/1998 | Iwata | 708/313 |
| 5,872,531 A | * | 2/1999 | Johnson et al. | 341/110 |
| 6,084,791 A | * | 7/2000 | Gopfrich | 363/98 |
| 6,198,783 B1 | * | 3/2001 | Campana, Jr. | 375/346 |
| 6,301,308 B1 | * | 10/2001 | Rector | 375/270 |
| 6,539,411 B1 | * | 3/2003 | Johnson | 708/271 |
| 6,549,757 B1 | * | 4/2003 | Masse et al. | 455/67.13 |
| 6,556,509 B1 | * | 4/2003 | Cekorich et al. | 356/477 |
| 6,654,427 B1 | * | 11/2003 | Ma et al. | 375/297 |
| 6,795,740 B1 | * | 9/2004 | Chu et al. | 700/94 |
| 2002/0116199 A1 | * | 8/2002 | Wu et al. | 704/500 |
| 2003/0099180 A1 | * | 5/2003 | Park et al. | 369/59.25 |
| 2004/0039565 A1 | * | 2/2004 | Kulas | 704/200 |
| 2004/0075462 A1 | * | 4/2004 | Kizer et al. | 326/29 |
| 2004/0108948 A1 | * | 6/2004 | Stevens et al. | 341/155 |
| 2004/0156293 A1 | * | 8/2004 | Pozidis et al. | 369/59.22 |
| 2005/0271367 A1 | * | 12/2005 | Lee et al. | 386/96 |

* cited by examiner

*Primary Examiner*—Gregory M Desire

(57) ABSTRACT

A system allows greater dynamic range in fixed-width sample representations of waveforms. Known properties of the waveform are used to determine an unlikely, or impossible, data condition to be used as an exception condition. Samples following the exception condition are assumed to be shifted by a predetermined amount so that their representation within the allowable dynamic range of the word results in an extended dynamic range. In a preferred embodiment, pre-processing of a waveform is used to create exception conditions and to shift portions of the waveform that would otherwise become clipped, so that the waveform peaks reside in a shifted position within the digital representation. Analogously, playback processing serves to detect the exception conditions and to restore the peaks of the waveform back to their original status for, e.g., audible digital-to-analog playback, high-resolution processing, etc.

20 Claims, 5 Drawing Sheets

Packing Routine

Unpacking Routine
Fig. 5B

Packing Routine
Fig. 5A

DIGITAL REPRESENTATION OF AUDIO WAVEFORMS USING PEAK SHIFTING TO PROVIDE INCREASED DYNAMIC RANGE

BACKGROUND OF THE INVENTION

This invention relates in general to digital representation of data and more specifically to a system for increasing the range of representable values in waveforms.

Digital processing is used advantageously in many aspects of signal processing including audio, image, radio-frequency, infrared, math functions, etc. A signal is typically captured to the digital domain by analog-to-digital conversion of a physical signal to a digital waveform representation. Once the physical signal has been captured digitally, it can be modified, manipulated, copied, transferred, etc., with little or no degradation to the waveform and with many advantages provided by digital processing.

However, a problem arises with traditional approaches to digital waveform representation. Typically, the waveform is represented by a large number of "samples." Each sample is a digital value (usually binary) and is represented by a digital "word" that is a fixed number of bits in width. The number of bits in a word dictates the possible range of values that can be represented in a sample corresponding to the word. If the sample needs a value that is larger than can be represented by a word then the waveform can not be accurately represented and a condition known as "clipping" occurs.

When an audio signal is digitally clipped, the waveform representation no longer is a true representation of the desired audio signal. Instead, the sample values are represented by the closest value allowed by the word width in a processing system. Typically, this means that the word values are at their highest maximum positive or negative magnitudes for the duration of the signal extending beyond the representable values of the sample size. The range of values that can be handled by a processing system is referred to as the "dynamic range" or "bit width," "word width," etc., of the system.

Since different systems may have different dynamic ranges, the clipping effect may make it undesirable, or impossible, for different systems to work together or to exchange data. Increasing the dynamic range of a system is often not possible after the system has been manufactured. The production of systems with larger dynamic range is more expensive and often more difficult since more processing power, larger buses, higher performance and wider memory, and improvements in other resources must be included in the systems.

SUMMARY OF THE INVENTION

The present invention provides a mechanism allowing greater dynamic range in fixed-width sample representations of waveforms. Known properties of the waveform are used to determine an unlikely, or impossible, data condition to be used as an exception condition. In a preferred embodiment that is directed to processing of audio waveforms, a first large value transitioning to a second large value of different sign is used to indicate an exception condition. Samples following the exception condition are assumed to be shifted by a predetermined amount so that their representation within the allowable dynamic range of the word results in an extended dynamic range.

In a preferred embodiment, pre-processing of a waveform is used to create exception conditions and to perform "peak packing" to shift portions of the waveform that would otherwise become clipped, so that the waveform peaks reside in a shifted position within the digital representation. Analogously, playback processing serves to detect the exception conditions and to restore the peaks of the waveform back to their original status for, e.g., audible digital-to-analog playback, high-resolution processing, etc.

In one embodiment A method for processing a digitally represented waveform, wherein the digitally represented waveform includes multiple words of a fixed bit-width, wherein each word has a value, the method comprising determining when a word's value exceeds a predetermined threshold; shifting the value of the word to result in a value that does not exceed the predetermined threshold; and replacing the word's value with the shifted value.

In another embodiment the invention provides a method for reconstructing a digitally represented waveform, wherein the digitally represented waveform includes multiple words of a fixed bit-width, wherein each word has a value, wherein a predefined exception condition is used to indicate special processing of one or more of the multiple words, the method comprising detecting the exception condition; and upon detection of the exception condition performing an operation to modify one or more subsequent word values.

DETAILED DESCRIPTION OF THE PREFERRED EMBODIMENTS

Figure 1A:
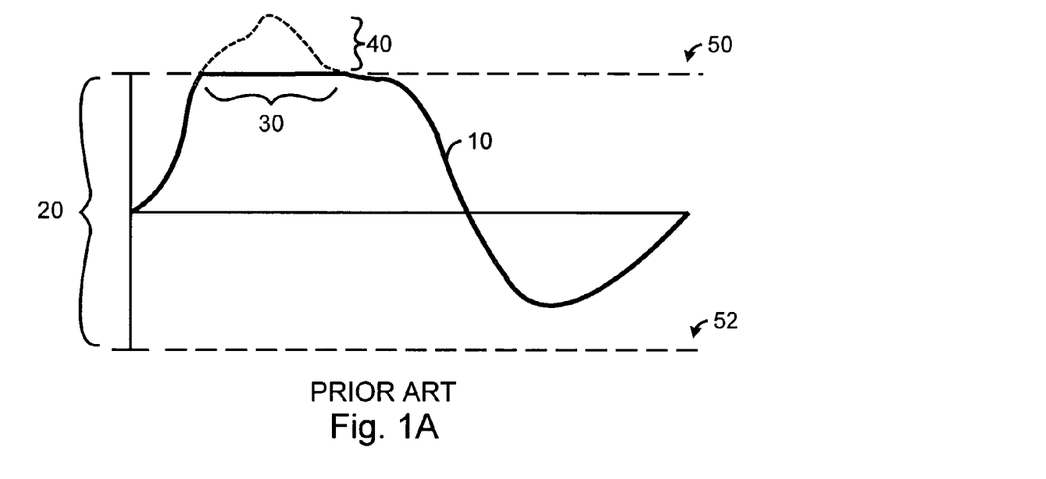
FIG. 1A is a prior art illustration of a waveform representation.

FIG. 1A is a prior art illustration of a waveform representation.

In FIG. 1A, waveform 10 is represented by fixed-width words having dynamic range 20. For example, if the words are 8 bits in width then the dynamic range is 256 values. If the word width is 16 bits then the dynamic range is 64k values. If the word 30 width is 32 bits then the dynamic range is 2^32 values, etc. Note that any suitable word width can be used.

Waveform 10 includes a clipped region 30 where the desired waveform values exceed the dynamic range of the words. This results in a loss of the signal data shown as a dashed line at 40. Rather than provide an accurate reproduction of the signal, all signal information above the maximum representable value at 50 is lost. Instead, the waveform is clipped to a flat region that stays at the closest possible representable value. Note that such clipping can also occur in a negative portion of the waveform if a signal extends below the maximum negative magnitude at 52. A discussion of the approach of the invention with respect to positive peaks is also applicable to negative peaks.

Note that any form of word number or value representation is possible. In other words, the word values can be used in any digital numbering scheme (e.g., binary, octal, hexadecimal, etc.) in unsigned integer, sign-magnitude, one's complement, two's complement, floating point or any suitable format. For case of discussion, a signed integer value representation is assumed.

As is known in the art, the waveform changes with time. Time is represented as increasing to the right along the horizontal axis. The central axis, midway between maximum 50 and minimum 52, represents a zero value.

Figure 1B:
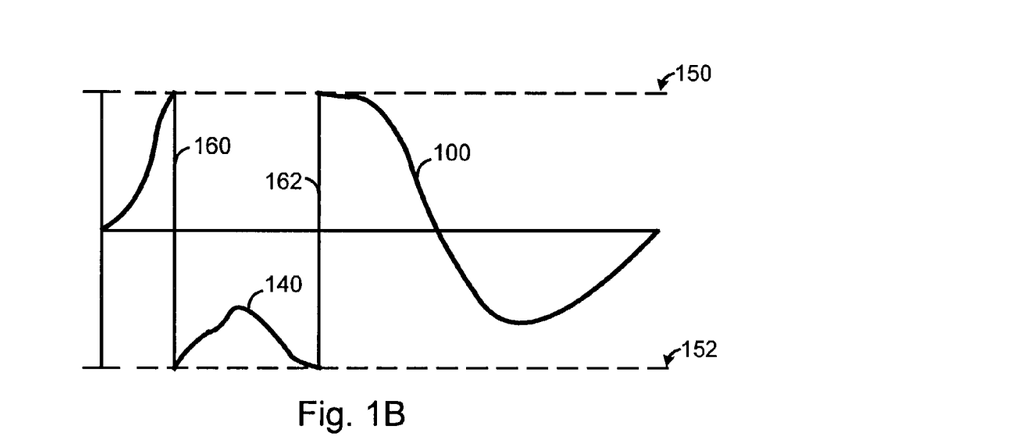
FIG. 1B illustrates a peak packing operation according to the present invention.

FIG. 1B illustrates an approach of the present invention to represent the otherwise clipped peak within the same dynamic range as that depicted in FIG. 1A.

In FIG. 1B, waveform 100 corresponds to the same signal discussed in FIG. 1A. Note that peak 140 that is clipped in FIG. 1A is now preserved by shifting the values corresponding to the peak to start at minimum 152. In this manner, the waveform can be represented by an effectively larger dynamic range although the word width does not need to vary. Vertical lines 160 and 162 are not actually part of the waveform representation but are used to show a discontinuity in the waveform representation. In a preferred embodiment, these discontinuities are used to indicate an exception condition to alert a playback processing device to reposition the shifted peak data to achieve the original signal.

Figure 1C:
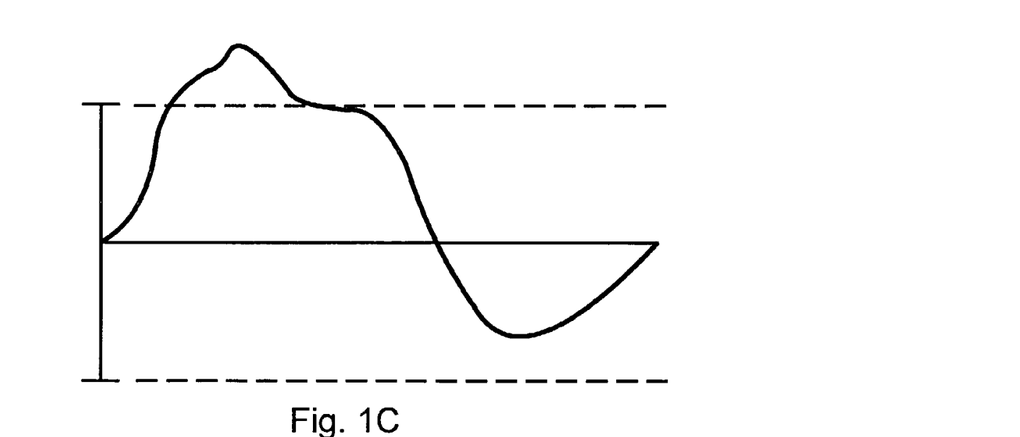
FIG. 1C shows the result of unpacking the packed waveform of FIG. 1B.

FIG. 1C shows the result of repositioning the shifted peak data of FIG. 1B. In FIG. 1C, peak 140 of FIG. 1B is shown restored to the waveform to achieve an accurate reproduction of the signal. This approach can be used, for example, to obtain higher quality digital-to-analog (D/A) conversion of signals with a given word width. Also, where different processing systems use different word widths it is possible to process a signal from a larger word width system in a smaller word width system. Transfer of signals over bus widths that are smaller than the original waveform word width representation are possible.

The exception condition is chosen so that it is impossible, or unlikely, to occur with a valid waveform. For a real-world audio signal, the event of waveform values swinging from the largest positive to the largest negative value in adjacent samples will not occur. Neither will values swing from largest negative to largest positive values. In other embodiments, other exception conditions can be used depending on predictable properties or characteristics of the waveform. For example, smaller swings, second or third derivatives, impulse patterns, value or bitwise anomalies, etc., can all be used to indicate an exception condition.

In the preferred embodiment, the exception condition uses ranges of values, rather than absolute maximum (i.e., largest positive) and absolute minimum (i.e., largest negative) values. For example, an exception condition is defined as where a first word value is above a first threshold near the maximum and the next word value is below a second threshold near the minimum. The thresholds are used to set maximum and minimum ranges where, if two adjacent word values lie in each of the ranges, an exception condition occurs. Other types of exception conditions can require multiple words to be within one or more specific ranges, require multiple alternations among ranges or values, etc. In general, any type of exception condition can be used.

Note that the approach of a preferred embodiment uses the same number of words to represent a waveform with increased dynamic range. This approach is referred to as "peak packing." A peak packing process can be performed quickly, such as in real time, because it only requires comparing values of two adjacent words. A clipping condition is known by comparing a desired word value to the limits of the dynamic range of a target data stream. If the desired value exceeds the dynamic range then peak packing is performed. In a preferred embodiment, the modification to word values in the clipping region is a simple shift of the values. Other embodiments can use other types of processing such as comparison, combination or other detection of multiple word values and more complex logical or arithmetic operations for processing word values in the clipping region. Similarly, reconstruction of a peak packed waveform requires only small amounts of processing and can be done on-the-fly to detect the exception condition and reverse the shifting (or other processing) operation.

In general, any type of processing to deconstruct a signal to a peak packed waveform and to reconstruct a signal from a peak packed waveform is possible and within the scope of the invention. For example, the processing can be done in real time or non-real time. The processing can be performed in hardware or software or by a combination of both. Different types of processing (e.g., using different exception conditions) can be performed at different times, and in different regions of a waveform. It may be desirable to perform peak packing on portions of a waveform that are not being clipped (i.e., that remain within the dynamic range of the word width). Other advantages will become apparent.

Figure 2A:
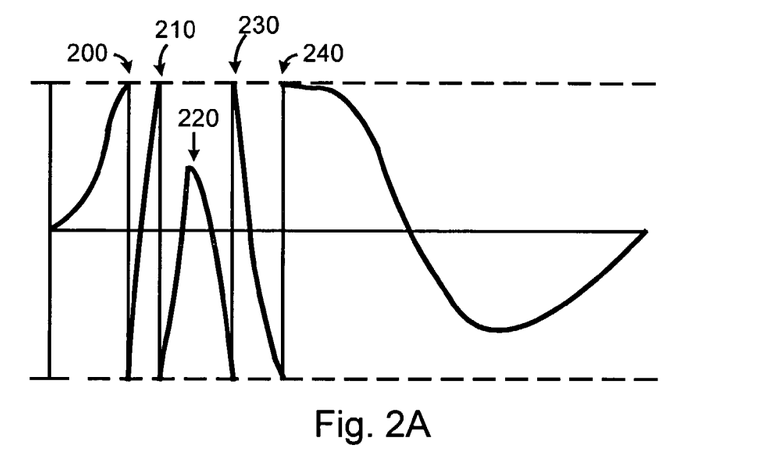
FIG. 2A shows two iterations of peak packing.
Figure 2B:
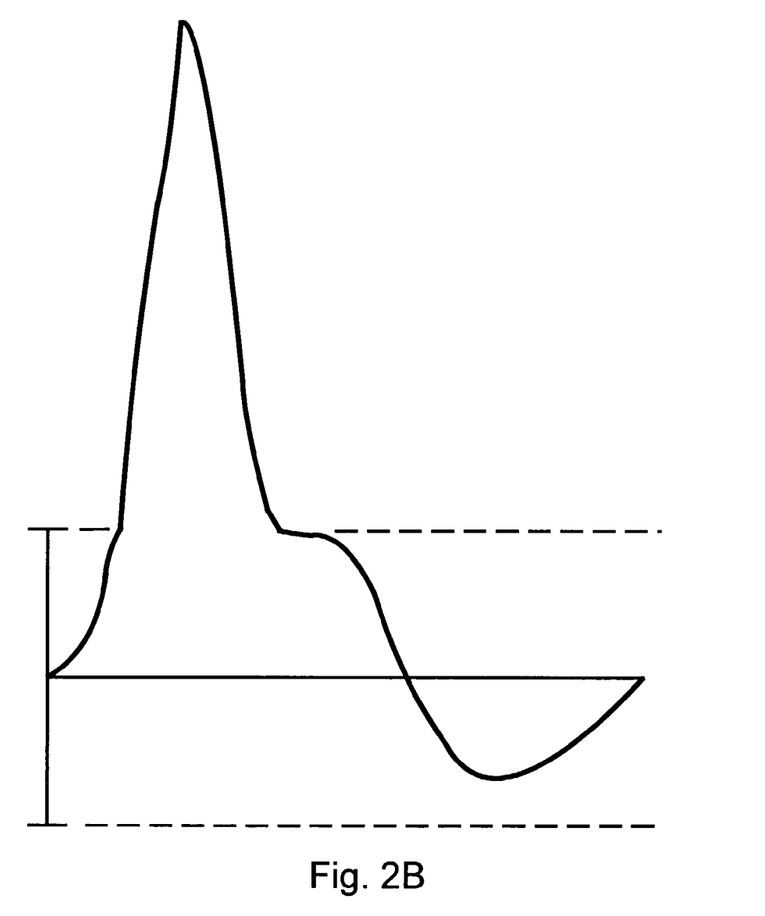
FIG. 2B illustrates unpacking of the waveform values of FIG. 2A.

FIGS. 2A and 2B illustrate multiple peak packing.

FIG. 2A, a signal has been peak packed into a fixed dynamic range by two iterations of peak packing. A fist clip condition occurs at 200 and subsequent waveform values are shifted to the opposite extent of the word value representations (i.e., maximum negative). At 210, the peak packing operation still results in a clip condition so another shift is performed so that subsequent words of peak 220 are now subjected to the compounded operation of two shifts (or the equivalent). When peak 220's values fall at or near the greatest negative extent of the dynamic range, the word values are no longer subjected to the second shift operation so that the values resume at 230 subjected only to the first shift. As the waveform values continue to decrease in value they eventually again approach the greatest negative extent whereupon they are no longer subjected to the first shift operation and so resume at their normal representation at 240.

FIG. 2B shows the reconstruction of the peak packed signal of FIG. 2A. As can be seen by the vertical (i.e., time) correspondence between the FIGS., the peak segments between 200 and 240 are shifted by multiples of the dynamic range to achieve an accurate reproduction of a signal that extends well beyond the standard word value representation.

Figure 3A:
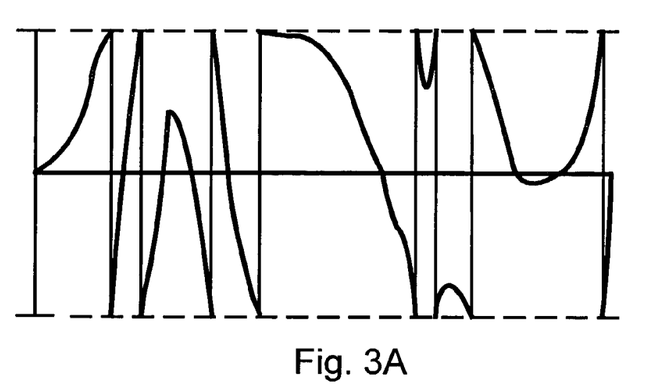
FIG. 3A illustrates a waveform with both positive and negative peak packing.
Figure 3B:
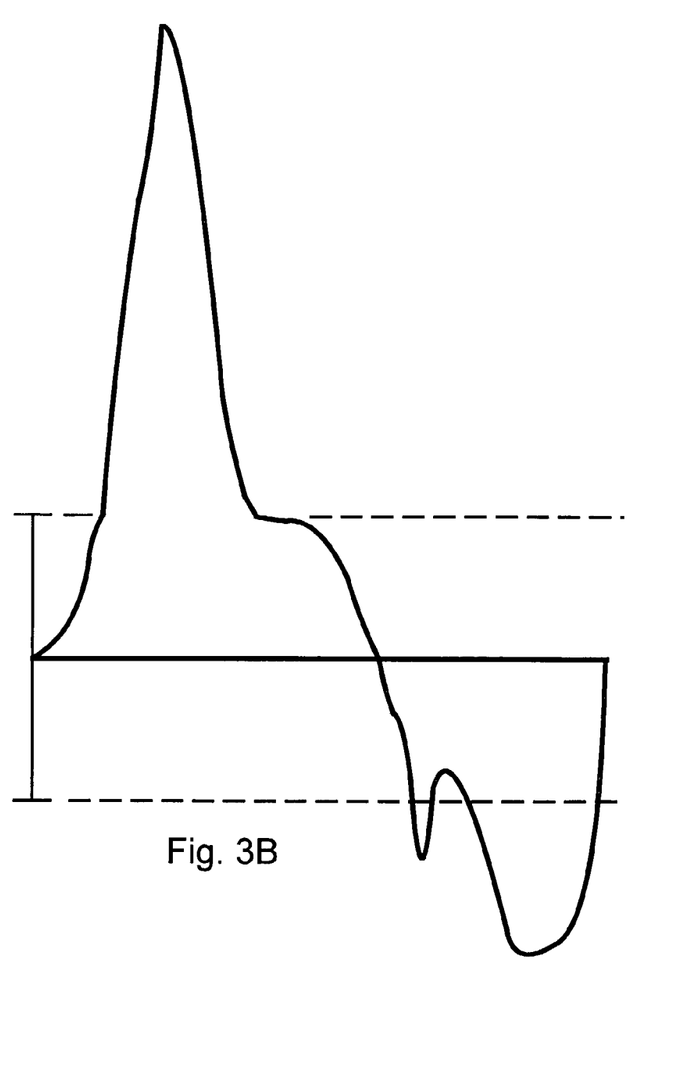
FIG. 3B shows the reconstruction of the packed waveform of FIG. 3A.

FIG. 3A illustrates a waveform with both positive and negative peak packing. FIG. 3B shows the reconstruction of the packed waveform of FIG. 3A. Note that any number of waveform cycles and any shape or type of waveform can be used with the approach of the present invention.

Figure 4:
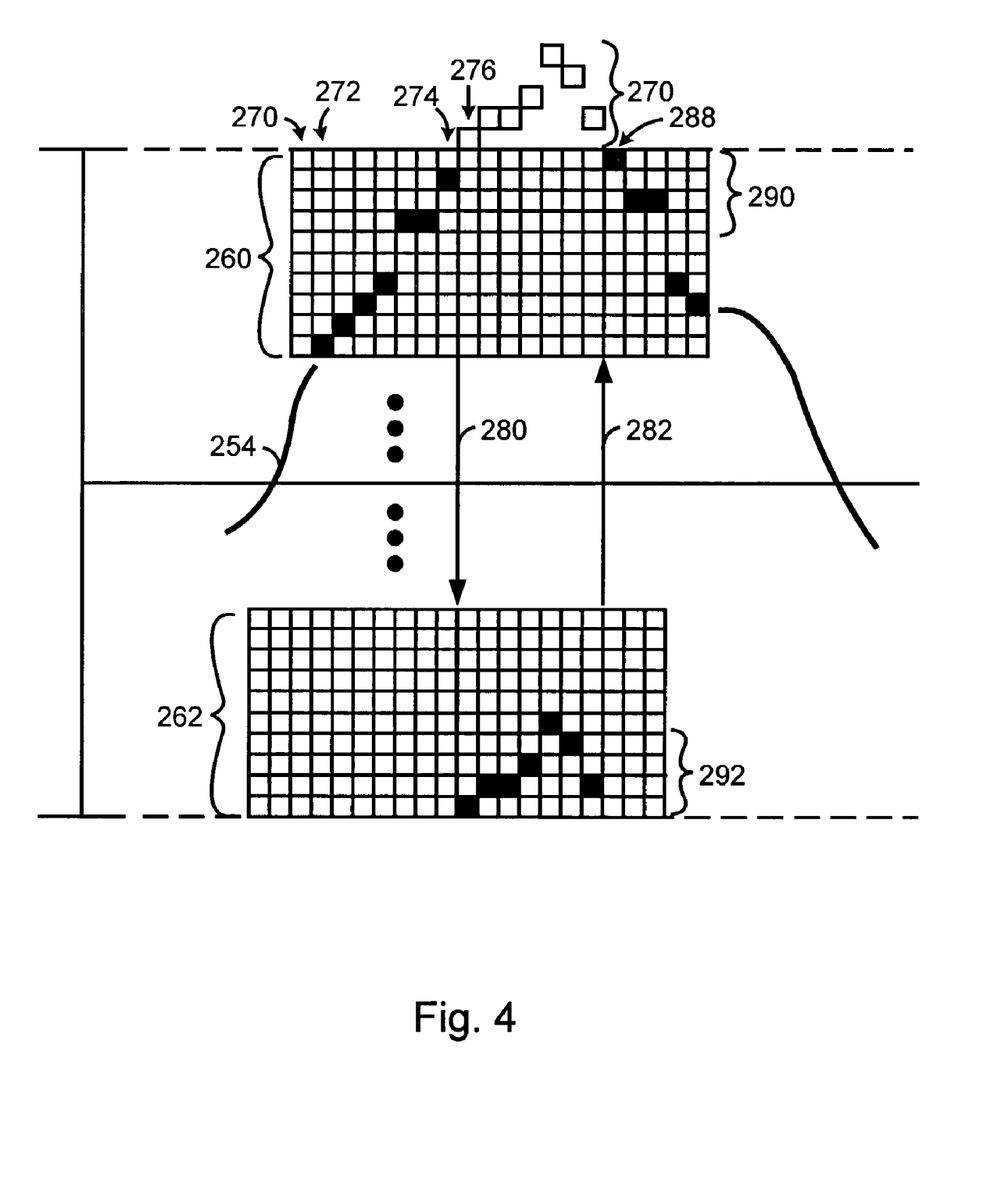
FIG. 4 illustrates details of the invention at the word value level.

FIG. 4 illustrates details of an approach of the invention.

In FIG. 4, waveform 254 is shown with portions expanded so that values are represented as points in grid sections. Grid section 260 includes columns corresponding to word values at 270, 272, 274, etc. Each word has a numeric value that is represented by a solid square at the corresponding waveform point position. For example, assuming a 16-bit two's complement representation, the value of words 270 and 272 is 2^15−1−9=32758. The value of word 274 is 2^15−1−1=32766. This type of representation is well-known in the art.

Word 276 does not have sufficient dynamic range to represent its signal value which would be 32768. Thus, the technique of the present invention shifts the value by 16 bits, (or, analogously, divides or subtracts, or performs other functions or combinations of functions) to generate a new value for word 276 of −32768. This results in a very large difference between adjacent words 274 and 276 to produce a discontinuity indicated by the arrow at 280. The transition is from a large positive number, 32766, to a large negative number, −32768. This transition is easily detectable upon playback or other processing of the waveform and will be used as an exception condition.

Note that an exception condition occurs in the other direction, at 282, from word 286 to word 288, to produce a detectable exception condition to restore the normal interpretation (i.e., unshifted) of the values of the waveform.

A preferred embodiment detects when adjacent word values transition from a first range to a second range. In the example of FIG. 4, the first range is indicated at 290 and includes the values 32764 through 32767. The value 32766 is considered a "threshold" value so that any values above it are considered to be within the first range. A second range is defined at 292 to include values of −32768 through −32764. Naturally, any range of values can be used. Multiple different ranges, regions, area, sets, etc. of values can be used to define exception conditions. The detection of an exception condition does not have to be between adjacent words but can use separated words, groups of words, mere areas or portions of words, etc.

Figure 5A:
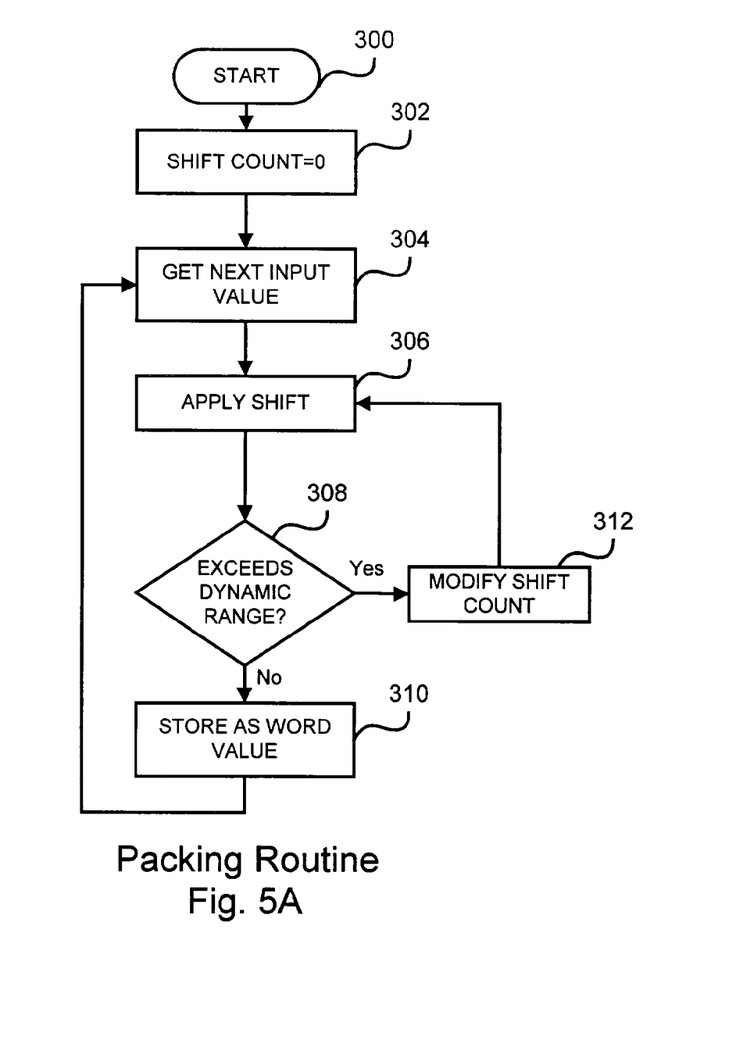
FIG. 5A shows a flowchart of basic steps of a packing routine.

FIG. 5A illustrates a flowchart of basic steps in a routine to perform the packing operation according to one aspect of the invention.

In FIG. 5A, the packing routine is entered at 300 where it is assumed there is a waveform represented by input values to be packed into a stream of words. At step 302, a shift count is set to zero. A zero value for the shift count means no shift will be performed. A positive value for the shift count indicates large positive values are to be shifted downward, or decreased in value, so that they will fit within the dynamic range of the word stream.

At step 304 a next input value from a waveform to be packed is obtained. Note that the input values can be obtained from memory, an input port, processor, network, or any other source. The input values can be derived from physical signals via an analog-to-digital converter (A/D) or other device. At step 306 any designated shifting is performed to the input value.

Next, a check is made at step 308 as to whether the input value exceeds the dynamic range. If not, the value is stored into a word at step 310 and execution proceeds to step 304 to get successive values. Otherwise if, at step 308, the input value exceeds the dynamic range, step 312 is performed to modify the shift count dependent on whether the excessive value is greater than, or less than, the values that can be represented by the dynamic range of the target word width. For example, if the input value is greater than the maximum allowable for the dynamic range then the shift count is incremented. If the input value is less than the minimum allowable then the shift count is decremented.

Execution continues until there is no more input data or until some other condition (e.g., user control) causes termination.

Figure 5B:
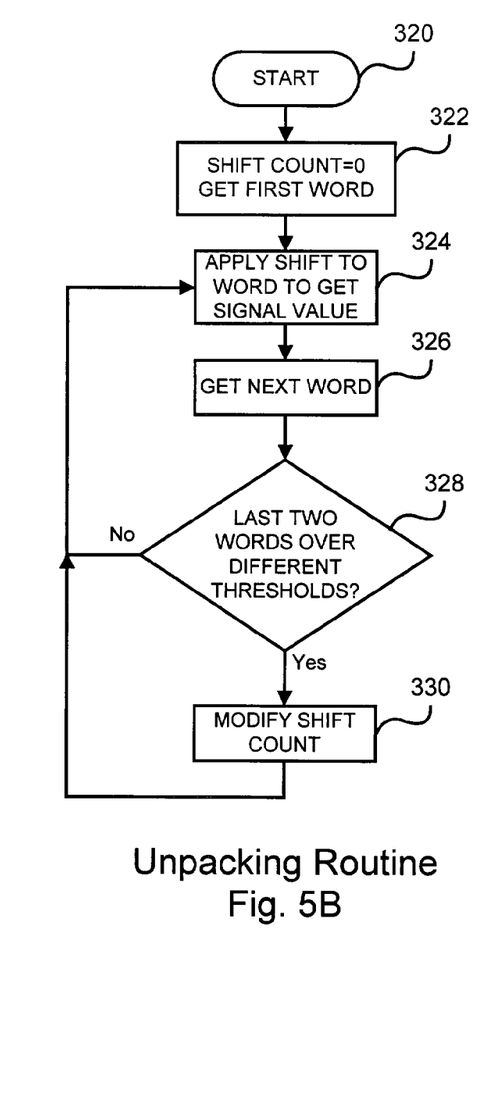
FIG. 5B shows a flowchart of basic steps of an unpacking routine.

FIG. 5B illustrates basic steps in a routine to perform unpacking.

In FIG. 5B, an unpacking routine is entered at 320 when it is desired to unpack a packed waveform to obtain the original signal. At step 322 the shift count is set to 0 and the first word of the waveform is obtained. At step 324 the shift count is used to apply shifting, if needed. As before, a shift count of zero indicates that no shift is to be performed and the word value is used to generate a signal amplitude, or point. If the shift count is positive then the word value is increased by shifting up (i.e., left) by the number of bits in the word width multiplied by the shift count. Similarly, if the shift count is negative then the word value is shifted down by the number of bits in the word width multiplied by the absolute value of the shift count.

The shifted value is stored, or used, as a point in the reconstructed signal. For example, the point can be stored in the traditional manner in a word of sufficient width. The point can also be translated, e.g., to a voltage, current or other physical property, so that the signal can be played back, used as a control signal, etc. The original word value is stored so that it can be used in the comparison at step 328, described, below.

The above discussion with respect to steps 320-324 assumes that the first word of a waveform is not shifted. If it is necessary to shift the first word value then the shift count can be supplied by an external routine or other source and it will not be initialized at step 322 when the unpacking routine is entered.

At step 326, the next word is obtained. Step 328 checks whether the last two word values obtained are over different thresholds. In other words, if there is a large (i.e., greater than threshold-to-threshold) swing of adjacent word values this exception condition is detected by step 328. If an exception condition is not detected then processing returns to step 324 where any necessary shifting is performed on the current word value (i.e., the one just obtained at step 326). If an exception condition is detected then step 330 is executed to modify the shift count in accordance with the direction of the exception condition. In other words, if the swing is from positive to negative (or high to low, greater to lesser, etc.) then the shift count is incremented. If the swing is from negative to positive the shift count is decremented.

Many other ways of performing packing and unpacking will be apparent. The routines depicted in this application are merely basic examples. Steps can be performed by hardware or software, as desired. Note that steps can be added to, taken from or modified from the steps in the flowcharts presented in this specification without deviating from the scope of the invention. In general, the flowcharts are only used to indicate one possible sequence of basic operations to achieve a functional aspect of the present invention.

Any suitable programming language can be used to implement the routines of the present invention including C, C++, Java, assembly language, etc. Different programming techniques can be employed such as procedural or object oriented. The routines can execute on a single processing device or multiple processors. Although the flowchart format demands that the steps be presented in a specific order, this order may be changed. Multiple steps can be performed at the same time. The flowchart sequence can be interrupted. The routines can operate in an operating system environment or as stand-alone routines occupying all, or a substantial part, of the system processing.

Although the invention has been described with respect to specific embodiments, thereof, these embodiments are merely illustrative, and not restrictive of the invention. For example, although the invention is directed to audio applications, other types of waveform representations can be used such as image, radar, mathematical functions, etc. In general, any waveform with at least one predictable characteristic or property from which an exception condition can be detected can be suitable for use with the present invention.

Note that exception conditions can be used for other purposes rather than peak packing. For example, the number, type, pattern or other properties of one or more packed or otherwise modified waveforms can be used to, e.g., encrypt or encode a signal, place a signature or watermark onto the signal, impose text or numerical information onto the waveform, etc.

Thus, the scope of the invention is to be determined solely by the appended claims.

What is claimed is:

1. A method for creating a digital representation of a waveform, wherein the digital representation includes multiple words each having a value so that possible values define a range of representation, the method comprising:
   using a value of a first word in the digital representation to create a discontinuity in the digital representation of the waveform;
   inserting subsequent words to represent a portion of the digital waveform continuously relative to the first word; and
   outputting at least a portion of the words and the discontinuity so that the range of representation of the digital waveform can be increased during presentation of the waveform in response to detecting the discontinuity.

2. The method of claim 1, wherein the waveform is an audio waveform, wherein the presentation includes an audio presentation.

3. The method of claim 1, wherein the waveform is an image waveform, wherein the presentation includes an image presentation.

4. The method of claim 1, wherein the waveform is a math function, wherein the presentation includes visually depicting at least a portion of the math function.

5. The method of claim 2, wherein the word values are time sequenced, the method further comprising:
   detecting when a first word value is near a maximum word value; and
   subsequently modifying a next word value in the time sequence to be near a minimum word value.

6. The method of claim 1, wherein a word value can be positive or negative.

7. The method of claim 1, wherein a word value is an unsigned integer value.

8. A method for presenting a digitally represented waveform, wherein the digitally represented waveform includes multiple words, wherein each word has a value so that possible values define a range of representation, the method comprising:
   detecting a first discontinuity at a first word in the digitally represented waveform;
   detecting words subsequent to the first word;
   detecting a second discontinuity at a second word in the digitally represented waveform; and
   adjusting values of at least a portion of the subsequent words between the first and second words so that a continuous waveform having an increased range of representation is presented.

9. The method of claim 8, further comprising:
   determining that a first word value is above a first predetermined threshold; and
   determining that a second word value is below a second predetermined threshold.

10. The method of claim 8, further comprising:
    shifting the one or more subsequent values to restore a portion of the digitally represented waveform.

11. The method of claim 8, wherein an exception condition is determined by comparing a transition to the first word value from a word value prior to the first word.

12. The method of claim 11, wherein the exception condition is a transition from a large value to a small value.

13. The method of claim 12, wherein the exception condition is a transition from a maximum value to a minimum value.

14. The method of claim 11, wherein the exception condition includes a derivative of a change in multiple word values.

15. The method of claim 11, wherein the exception condition includes a bit pattern anomaly in a word value.

16. The method of claim 11, wherein the exception condition includes a first word value in a first range and a second word value in a second range.

17. An apparatus for creating a digital representation of a waveform, wherein the digital representation includes multiple words each having a value so that possible values define a range of representation, the apparatus comprising:
    a processor;
    a machine-readable storage medium including instructions executable by the processor for
    using a value of a first word in the digital representation to create a discontinuity in the digital representation of the waveform;
    inserting subsequent words to represent a portion of the digital waveform continuously relative to the first word; and
    outputting at least a portion of the words and the discontinuity so that the range of representation of the digital waveform can be increased during presentation of the waveform in response to detecting the discontinuity.

18. A computer-readable storage medium including instructions executable by a processor for creating a digital representation of a waveform, wherein the digital representation includes multiple words each having a value so that possible values define a range of representation, the computer-readable storage medium comprising:
    using a value of a first word in the digital representation to create a discontinuity in the digital representation of the waveform;
    inserting subsequent words to represent a portion of the digital waveform continuously relative to the first word; and
    outputting at least a portion of the words and the discontinuity so that the range of representation of the digital waveform can be increased during presentation of the waveform in response to detecting the discontinuity.

19. An apparatus for presenting a digitally represented waveform, wherein the digitally represented waveform includes multiple words, wherein each word has a value so that possible values define a range of representation, the apparatus comprising:
    a processor;
    a machine-readable medium including one or more instructions executable by a processor for
    detecting a first discontinuity at a first word in the digitally represented waveform;
    detecting words subsequent to the first word;
    detecting a second discontinuity at a second word in the digitally represented waveform; and
    adjusting values of at least a portion of the subsequent words between the first and second words so that a continuous waveform having an increased range of representation is presented.

20. A computer-readable storage medium for presenting a digitally represented waveform, wherein the digitally represented waveform includes multiple words, wherein each word has a value, the computer-readable storage medium comprising one or more instructions for:

detecting a first discontinuity at a first word in the digitally represented waveform;

detecting words subsequent to the first word;

detecting a second discontinuity at a second word in the digitally represented waveform; and adjusting values of at least a portion of the subsequent words between the first and second words so that a continuous waveform is presented.

* * * * *